(12) United States Patent
Bedell et al.

(10) Patent No.: US 8,853,529 B2
(45) Date of Patent: Oct. 7, 2014

(54) FLEXIBLE III-V SOLAR CELL STRUCTURE

(75) Inventors: Stephen W. Bedell, Wappingers Falls, NY (US); Cheng-Wei Cheng, White Plains, NY (US); Bahman Hekmatshoartabari, White Plains, NY (US); Ning Li, White Plains, NY (US); Devendra K. Sadana, Pleasantville, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/568,121

(22) Filed: Aug. 6, 2012

(65) Prior Publication Data

US 2014/0007932 A1 Jan. 9, 2014

Related U.S. Application Data

(63) Continuation of application No. 13/543,459, filed on Jul. 6, 2012.

(51) Int. Cl.

| | |
|---|---|
| H01L 31/00 | (2006.01) |
| H01L 31/0687 | (2012.01) |
| H01L 31/0735 | (2012.01) |
| H01L 31/0304 | (2006.01) |
| H01L 31/18 | (2006.01) |
| H01L 21/02 | (2006.01) |

(52) U.S. Cl.
CPC ....... *H01L 31/06875* (2013.01); *H01L 31/0735* (2013.01); *H01L 31/03042* (2013.01); *H01L 31/1844* (2013.01); *H01L 21/02433* (2013.01); *H01L 21/02505* (2013.01); *H01L 21/02461* (2013.01); *H01L 21/02463* (2013.01); *H01L 21/02381* (2013.01); *H01L 21/02543* (2013.01); *H01L 21/02546* (2013.01)
USPC ............................................ 136/256; 136/262

(58) Field of Classification Search
CPC ..................... H01L 31/0687; H01L 31/06875; H01L 31/1892; H01L 31/1896
USPC .................................................. 136/256, 262
See application file for complete search history.

(56) References Cited

U.S. PATENT DOCUMENTS 4,889,565 A * 12/1989 Fan et al. ....................... 136/256
5,322,573 A 6/1994 Jain
(Continued)

FOREIGN PATENT DOCUMENTS

JP 06-163962 6/1994

OTHER PUBLICATIONS

Yoon, GaAs photovoltaics and optoelectronics using releasable multilayer epitaxial assemblies, Nature, May 20, 2010, Abstract.

(Continued)

*Primary Examiner* — Eli Mekhlin
(74) *Attorney, Agent, or Firm* — Louis J. Percello; Otterstedt, Ellenbogen & Kammer, LLP

(57) ABSTRACT

Solar cell structures include stacked layers in reverse order on a germanium substrate wherein a n++ (In)GaAs buffer layer plays dual roles as buffer and contact layers in the inverted structures. The absorbing layers employed in such exemplary structures are III-V layers such as (In)GaAs. Controlled spalling may be employed as part of the fabrication process for the solar cell structures, which may be single or multi-junction. The requirement for etching a buffer layer is eliminated, thereby facilitating the manufacturing process of devices using the disclosed structures.

14 Claims, 3 Drawing Sheets

(56) References Cited

U.S. PATENT DOCUMENTS

| | | |
|---|---|---|
| 5,376,185 A | 12/1994 | Wanlass |
| 6,566,595 B2 | 5/2003 | Suzuki |
| 7,488,890 B2 | 2/2009 | Takamoto |
| 7,553,691 B2 | 6/2009 | Fatemi |
| 7,875,906 B2 | 1/2011 | Nagai |
| 7,994,419 B2 | 8/2011 | Pan |
| 8,012,851 B2 | 9/2011 | Henley |
| 8,039,291 B2 | 10/2011 | Cornfeld |
| 2007/0151595 A1 | 7/2007 | Chiou |
| 2008/0245409 A1* | 10/2008 | Varghese et al. .............. 136/256 |
| 2010/0229926 A1 | 9/2010 | Newman |
| 2010/0307572 A1 | 12/2010 | Bedell |
| 2011/0048516 A1* | 3/2011 | Bedell et al. .................. 136/255 |
| 2011/0048517 A1 | 3/2011 | Bedell |
| 2011/0318866 A1 | 12/2011 | Pan |

OTHER PUBLICATIONS

Vitanov, Solar cell technology on the base of III-V heterostructures, Journal of Physics: Conference Series 253 (2010), pp. 1-6, IOP Publishing Ltd.

Anonymous, New method to make gallium arsenide solar cells, PHYSorg.com, May 20, 2010.

* cited by examiner

FLEXIBLE III-V SOLAR CELL STRUCTURE

CROSS-REFERENCE TO RELATED APPLICATION

This application is a continuation of U.S. patent application Ser. No. 13/543,459 filed Jul. 6, 2012, the complete disclosure of which is expressly incorporated herein in its entirety for all purposes.

FIELD

The present disclosure relates to the physical sciences, and, more particularly, to solar cell structures comprising III-V absorber material and the fabrication of such structures.

BACKGROUND

Direct gap III-V materials such as gallium arsenide are attractive candidates for making high efficiency solar cells due to their strong absorption properties. The fabrication of high efficiency III-V solar cells can be achieved by epitaxial growth of the structures using various techniques such as metal organic chemical vapor deposition and molecular beam epitaxy.

Referring to FIG. 1A, a conventional single junction III-V solar cell structure 10 is shown. This structure includes a base 12 positioned between an emitter layer 14 and a back surface field (BSF) layer 16. The base in the structure 10 is Zn:InGaAs, the emitter is Si:InGaAs and the BSF layer is Zn:InGaP. A window layer 18 and contact 20 are positioned above the emitter, the window layer being a ternary III-V material such as $Si:In_{0.5}Al_{0.5}P$ and the electrically conductive contact being $Si:In_{0.01}Ga_{0.99}As$. Ternary III-V materials help to minimize light absorption in the window layer. A p-type Ge substrate 22 oriented 6° towards <111> is positioned at the bottom of the structure 10. This conventional structure 10 requires the growth of a buffer region between the substrate and BSF layer 16. In this exemplary structure 10, the buffer is comprised of a $Zn:In_{0.01}Ga_{0.99}As$ layer 24A adjoining the BSF layer 16 and a $Zn:In_{0.5}Ga_{0.5}P$ layer 24B between and adjoining the top surface of the substrate 22 and the bottom surface of the top layer 24A of the buffer region 24. The buffer is provided in order to minimize antiphase boundaries (APB) defects that are formed while growing compound III-V materials on elemental substrates, such as germanium.

A conventional solar cell structure 30 including middle, top and bottom cells is shown in FIG. 1B and can be referred to as a tandem structure. In this exemplary structure 30, the middle cell is comprised of a p-Ga(In)As absorber layer or base 32, a n-Ga(In)As emitter layer 34 adjoining the top surface of the base 32, a window layer 36 adjoining the top surface of the emitter layer 34, and a BSF layer 38 adjoining the bottom surface of the base 32. The top cell is comprised of a p-GaInP base 40, an n-GaInP emitter layer 42, a window layer 44 and a BSF layer 46. A wide band gap tunnel junction 48 is provided between the top and middle cells. A germanium bottom cell includes a p-Ge base 50 and a n+ Ge emitter layer 52. A n-Ga(In)As buffer 54 is positioned between the emitter layer 52 of the bottom cell and a second wide band gap tunnel junction 48 that adjoins the middle cell. A nucleation layer 53 is formed between the emitter layer 52 and buffer 54. Top and bottom electrical contacts 56, 58 allow the structure 30 to be electrically coupled to other devices. A n+ Ga(In)As layer 60 is provided between the top contact 64 and the window layer 44 of the top cell. An antireflective coating 62 adjoins the window layer 44 of the top cell.

Solar cell structures can be initially grown in reverse order as shown in FIG. 2 to enhance functionality without performance degradation. In other words, the emitter layer may be provided near the bottom of the cell while the BSF layer is at or near the top. The solar cell structure 70 shown in FIG. 2 includes many of the same layers employed in the structure 10 shown in FIG. 1. The same reference numerals are employed to designate such layers. The buffer region 74 in the inverted structure 70 is doped with silicon as opposed to zinc. As indicated in the figure, the buffer layer 74A is formed of $Si:In_{0.01}Ga_{0.99}As$ and is 2.0 μm in thickness while the optional nucleation layer 74B is formed of $Si:In_{0.5}Ga_{0.5}P$. An etch stop layer 76 is formed between the ohmic contact layer 20 and the buffer layer 74A. A contact layer (not shown) may be provided on the BSF layer 16. The fabrication of a III-V solar cell structure such as shown in FIG. 2 involves growing the layers on a substrate, removing the germanium substrate 22 and the layers between the substrate and ohmic contact layer 20, none of which are part of the active device, and then further processing to produce a finished device. A metal lead (not shown) can then be formed on the contact layer 20.

SUMMARY

Principles of the present disclosure provide techniques for improving solar cell performance and facilitating manufacture of flexible solar cell structures. In one aspect, controlled spalling is employed whereby solar cell structures are grown in a reverse order on a germanium substrate in which the buffer layer is later utilized as the contact layer during cell fabrication. In accordance with an exemplary embodiment, a fabrication method includes providing a germanium substrate and forming a buffer region directly on the germanium substrate, the buffer region including a highly doped, electrically conductive layer comprising gallium arsenide. A solar cell structure is grown in inverted order on the buffer region, the solar cell structure including an absorbing layer comprising gallium arsenide, an emitter layer, a window layer adjoining the highly doped, electrically conductive layer, the emitter and window layers being formed between the buffer region and the absorbing layer, and a back surface field layer formed on a side of the absorbing layer opposite from the substrate. The highly doped, electrically conductive is functional as a buffer layer between the germanium substrate and the solar cell structure. The method further includes attaching a metal stressor layer to the solar cell structure, attaching a flexible handle layer to the metal stressor layer, and spalling the solar cell structure under the buffer region, wherein a fracture takes place at or below an interface between the buffer region and the germanium substrate using the metal stressor and flexible handle layers.

A further method includes providing a germanium substrate, forming a buffer region directly on the germanium substrate, the buffer region including a highly doped, electrically conductive layer comprising a III-V material, growing a single or multi-junction solar cell structure including at least one III-V absorbing layer in inverted order on the buffer region such that the highly doped, electrically conductive layer functions as a buffer layer between the germanium substrate and the solar cell structure, attaching a metal stressor layer to the solar cell structure, attaching a flexible handle layer to the metal stressor layer, spalling the solar cell structure under buffer region, wherein a fracture takes place at or below an interface between the buffer region and the germanium substrate using the metal stressor and flexible handle, if present on the buffer region following spalling, and removing a residual germanium layer from the buffer region. The highly doped, electrically conductive layer is functional as an ohmic contact layer for the solar cell structure upon completion of the method.

Photovoltaic elements are provided in accordance with further exemplary embodiments. In one such embodiment, a solar cell structure is provided that comprises a germanium substrate, a buffer region formed directly on the germanium substrate, the buffer region including a highly doped, electrically conductive layer comprising gallium arsenide, and a solar cell structure in inverted order on the buffer region, the solar cell structure including an absorbing layer comprising gallium arsenide, an emitter layer, a window layer adjoining the highly doped, electrically conductive layer of the buffer region, the emitter and window layers being formed between the buffer region and the absorbing layer, and a back surface field layer formed on a side of the absorbing layer opposite from the substrate. The highly doped, electrically conductive layer is functional as a buffer layer between the germanium substrate and the solar cell structure and is further functional as an ohmic contact layer for the solar cell structure upon removal of the germanium substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Techniques as disclosed herein can provide substantial beneficial technical effects. For example, one or more embodiments may provide one or more of the following advantages:

High open circuit voltage ($V_{oc}$)
High solar cell efficiency ($\eta$)
High fill factor (FF)
Simplified post-spalling process
Lower growth time These and other features and advantages of the present invention will become apparent from the following detailed description of illustrative embodiments thereof, which is to be read in connection with the accompanying drawings.

DETAILED DESCRIPTION

Exemplary solar cell structures disclosed herein include stacked layers in reverse order wherein a n++ (In)GaAs buffer layer plays dual roles as buffer and contact layers in the inverted structures. (The designation (In) signifies that the indium content is low (e.g. 1-3%) and that the InGaAs material is similar to GaAs.) The absorbing layers employed in such exemplary structures are III-V layers such as (In)GaAs. The stacked layers are grown on a germanium substrate. Controlled spalling may be employed as part of the fabrication process for the exemplary solar cell structures disclosed herein. The requirement for etching a buffer layer is eliminated, thereby facilitating the manufacturing process of devices using the disclosed structures.

Figure 1:
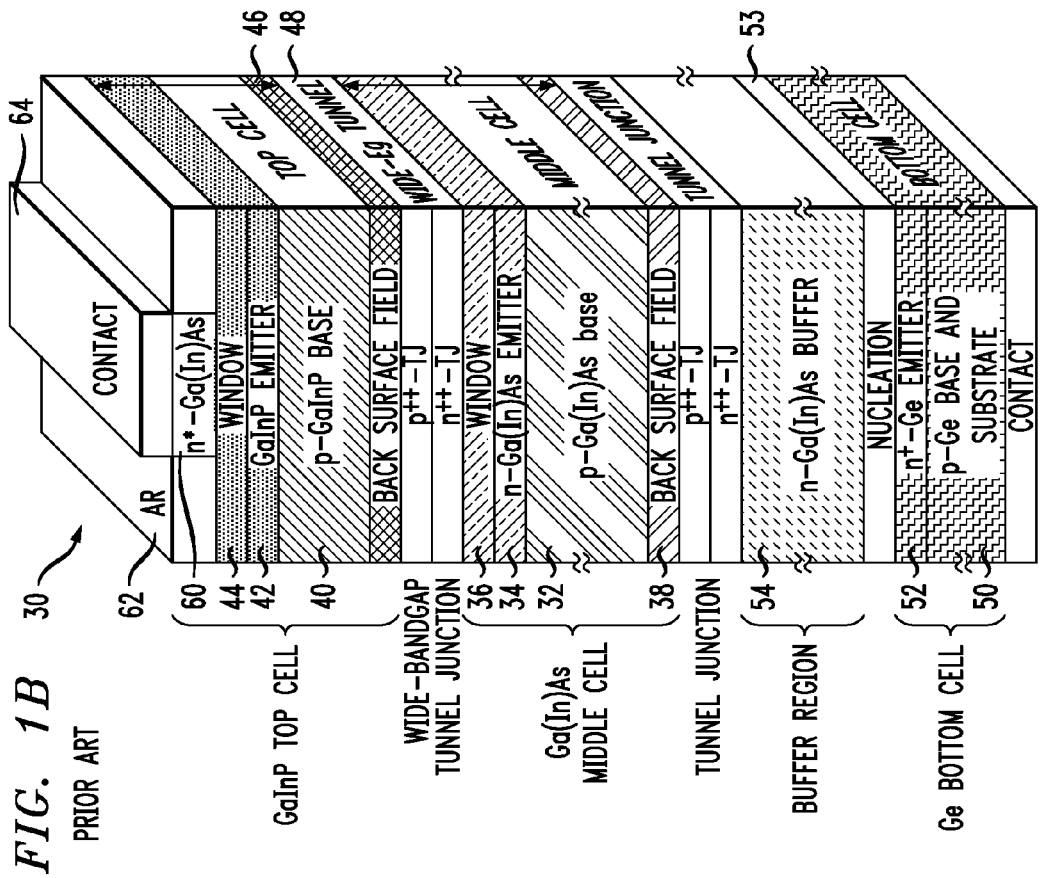
FIGS. 1A and 1B are schematic illustrations of conventional solar cell structures having p-type germanium substrates.
Figure 2:
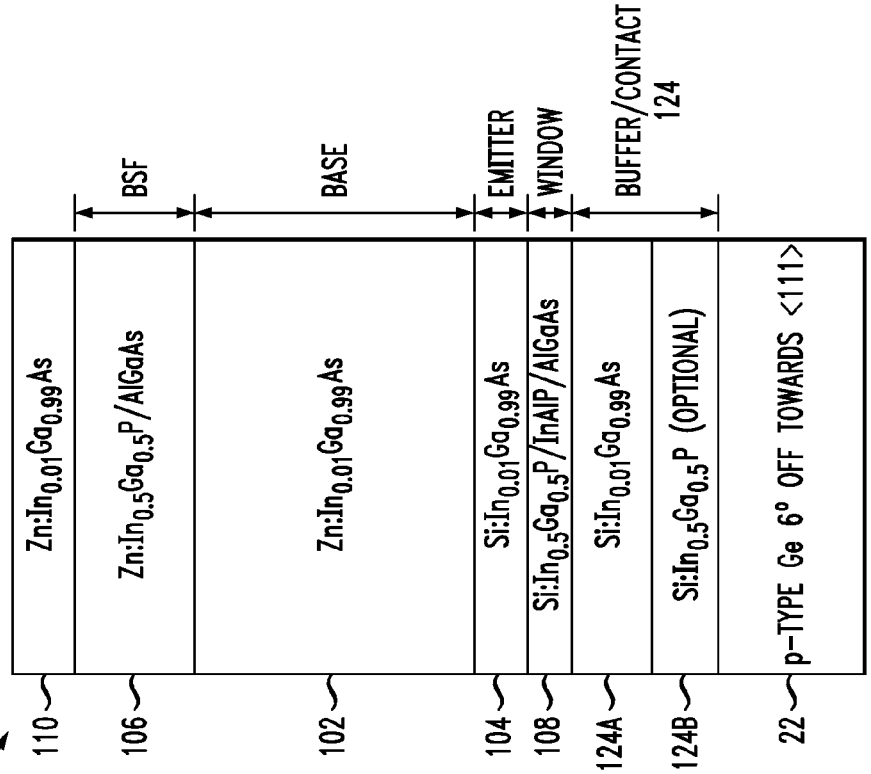
FIG. 2 is a schematic illustration of a conventional solar cell structure having a single junction and wherein certain layers are grown in reverse order.
Figure 3:
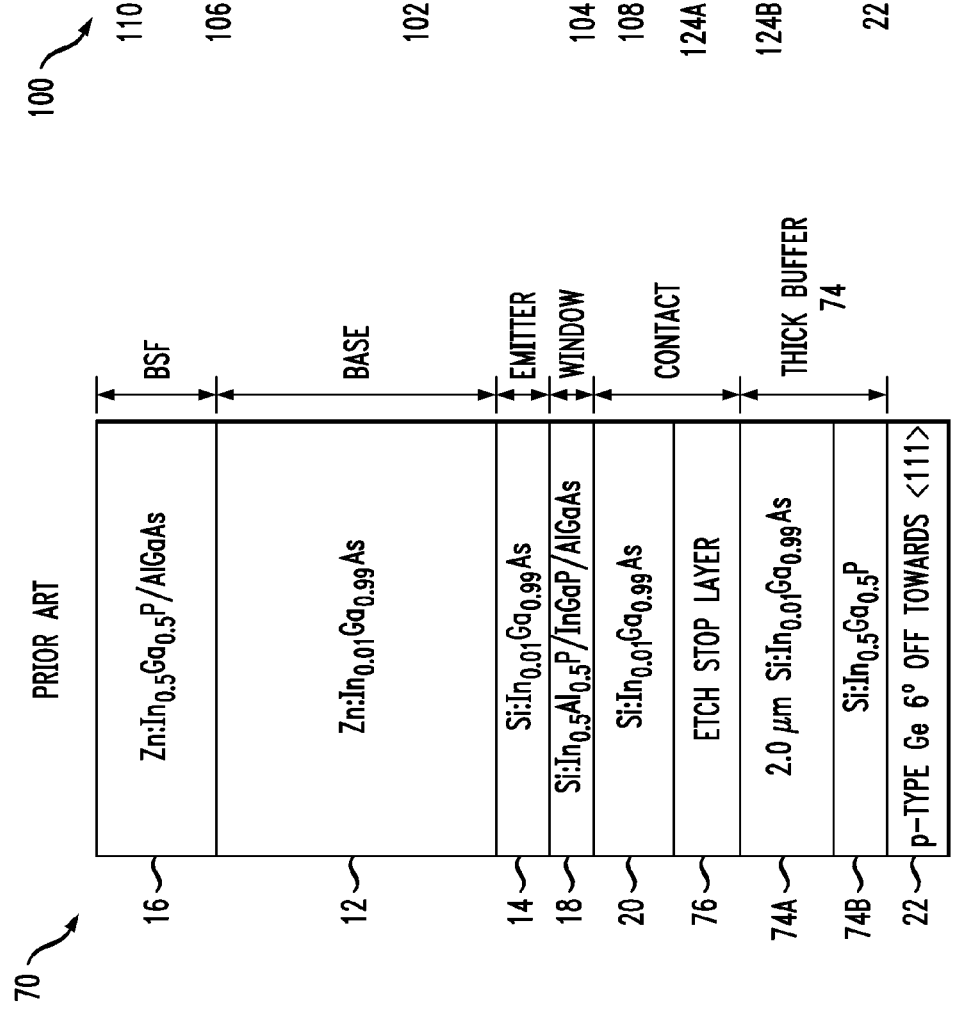
FIG. 3 is a schematic illustration of a flexible solar cell structure in accordance with an exemplary embodiment.

FIG. 3 shows a flexible solar cell structure 100 that can be produced by reverse order epitaxial growth followed by controlled spalling techniques such as disclosed in US Pub. Nos. 2010/0307572 and 2011/0048517, both of which are incorporated by reference herein. The structure 100 includes a light absorbing base layer 102 comprising a doped III-V material. In this exemplary embodiment, the base layer comprises Zn:In$_{0.01}$Ga$_{0.99}$As and is 3 μm in thickness with a dopant level of 1E17. The emitter layer 104 and the BSF layer 106 are formed below and above the base layer, respectively. AlGaAs, InGaP and GaAs are among the materials that may comprise the emitter layer. In this exemplary embodiment, the emitter layer is a 500 Å Si:In$_{0.01}$Ga$_{0.99}$As layer with a dopant level of 2E18. A NID:InGaAs layer may optionally be provided between the base layer 102 and emitter layer 104. The BSF layer may be comprised of materials such as InGaP, AlGaAs, or InGaAlP. In this exemplary embodiment, the BSF layer has a thickness of 100 nm and is formed from Zn:In$_{0.5}$Ga$_{0.5}$P. A contact layer 110 is formed on the BSF layer, for example a 500 Å layer of Zn:In$_{0.01}$Ga$_{0.99}$As having a doping level of 2E18. A window layer 108 adjoins the emitter layer and a n++ (In)GaAs buffer layer 124A. Suitable materials for the window layer 108 include InGaP, InAlP, InGaAlP and AlGaAs. The window layer in the disclosed structure 100 is formed of Si:In$_{0.5}$Ga$_{0.5}$P and has a thickness of 25 nm. The active layers of the solar cell structure, namely the base 102, emitter layer 104, BSF layer 106 and window layer 108 are characterized by low defect density. In this exemplary embodiment, the highly doped (e.g. 1E18-1E19 dopant levels) contact layer 124A of the buffer region 124 formed on the substrate 22 is a Si:In$_{0.01}$Ga$_{0.99}$As layer having a thickness of 0.5 μm and a dopant level of 3E18. Low defect density is not a requirement of the contact layer 124A, which is a passive element in the structure 100. This highly doped, electrically conductive layer 124A can be grown directly on the germanium substrate 22 and is capable of functioning as an ohmic contact layer with a metal layer (not shown) subsequently formed thereon as well as preventing antiphase defects that may otherwise occur if the active layers of the solar cell structure were grown directly on the germanium substrate 22. The indium concentration in the contact layer is low and should not exceed 2-3%. The buffer region 124 may further comprise an optional phosphide-based nucleation layer 124B (Si:In$_{0.5}$Ga$_{0.5}$P in this exemplary embodiment) between the germanium substrate 122 and the buffer layer 124A. The optional layer 124B has a thickness of 185 Å in this embodiment and a dopant level of 1E18. Such an optional layer 124B is generally grown in upright triple junction solar cells to prevent As diffusion in germanium, as As diffuses faster than phosphorus. This is to obtain shallower p/n junctions in germanium for such triple-junction cells. For the inverted structure where germanium is only used as a handle substrate, the growth of this layer is not required. The substrate employed in this exemplary embodiment is p-type germanium 6° off towards <111>. In alternative embodiments, the germanium substrate could be p-type or n-type and 0-15° off from <111> or <110>. The structure 100 is relatively thin and flexible. Comparing the structure 100 to the structure 70 shown in FIG. 2, the etch stop layer and relatively thick buffer region 74 are eliminated. As discussed below, the n++ (In)GaAs buffer layer 124A is used as an ohmic contact layer to which a metal layer can be applied during cell fabrication.

Figure 4:
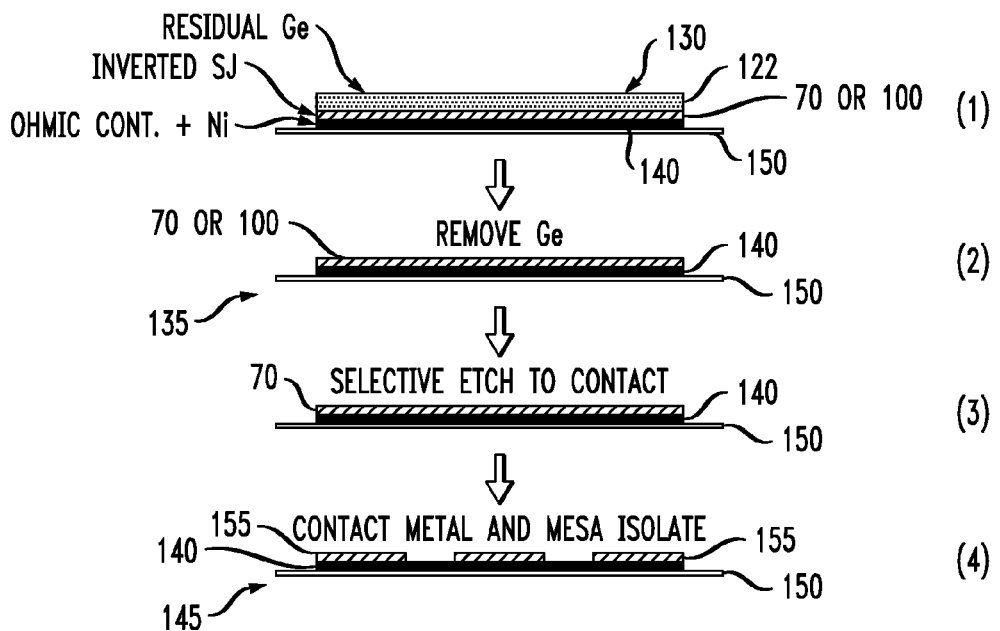
FIG. 4 is a schematic illustration of fabrication processes for making solar cell devices from solar cell structures as shown in FIG. 2 or 3.

FIG. 4 illustrates a fabrication process that shows certain benefits of employing the structure 100 as opposed to solar cell structures that include both buffer and ohmic contact layers such as the solar cell structure 70 discussed with respect to FIG. 2. Referring to the first step of the process, the starting structure 130 includes a layer 122 of residual germanium that may remain following spalling of the germanium substrate 22 on which the stacked, inverted layers of the structure 70 or 100 are formed. The structure 130 further includes a metal stressor layer 140 bonded to the stacked structure that can be made of nickel. This layer functions as a stressor layer. A flexible polymeric handle layer 150 such as a polyimide layer is adhered to the metal layer 140. Spalling is performed using the flexible handle layer 150 attached (e.g. bonded) to the metal (e.g. nickel) stressor layer 140. A fracture takes place under the buffer region at or below the interface of the buffer region with the germanium substrate 22. Following the spalling process, the resulting structure may include the layer 122 of residual germanium. The second illustrated step involves removal of the residual germanium layer 122 if present. This can be accomplished by chemical or physical etching. (The optional layer 124B, if used, would also be removed.) This step results in a structure 135 including the single junction stack comprising, for example, layers 102, 104, 106, 108, 110 as shown in FIG. 3, the ohmic contact layer comprising layers 124A, the metal layer 140, and the flexible layer 150. If the structure 100 shown in FIG. 3 is employed in this process, the third step illustrated in FIG. 4 is omitted as it is unnecessary. In contrast, if the structure 70 shown in FIG. 2 is further processed, the third step is necessary to remove layers 74A, 74B (if used), and the etch stop layer 76. The fourth illustrated step involves conventional front contact device fabrication. Contact metal is formed on the ohmic contact layer which comprises the buffer region 124, particularly layer 124A, if the structure 100 is employed. (If the structure 70 is employed, the contact metal is formed on the contact layer 20 following removal of the buffer 74 and etch stop layer 76 in the third illustrated step.) A mesa isolation process creates individual solar cell structures 155 from the structure 70 or 100, either of which may be wafer size. The resulting structure 145 can be diced and further processed as deemed necessary or appropriate.

Figure 5:
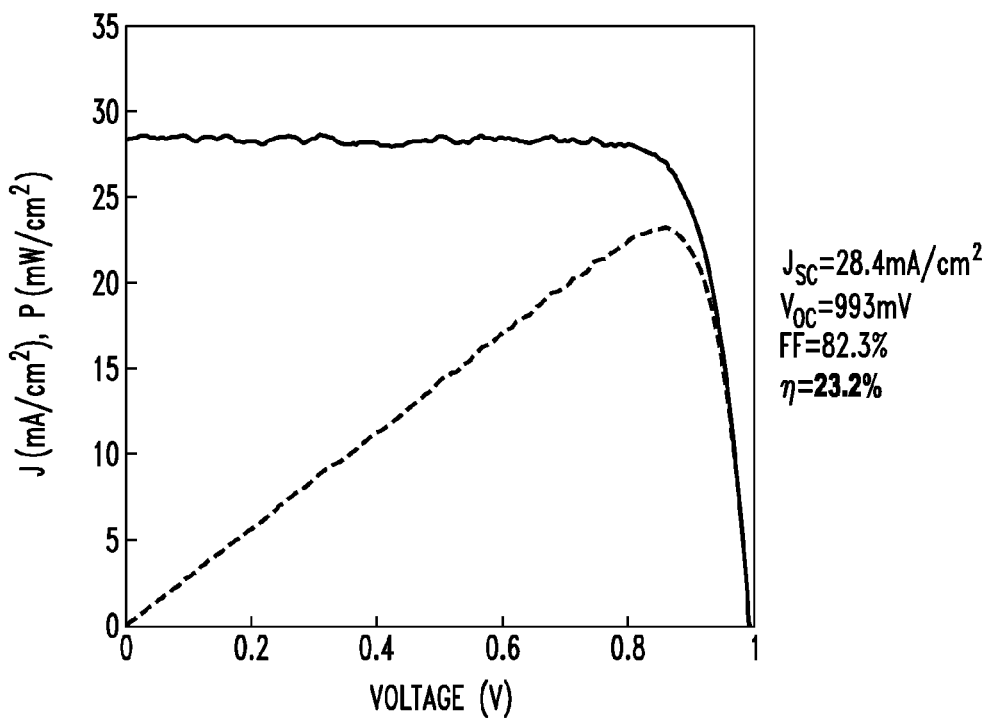
FIG. 5 is a diagram illustrating electrical characteristics of an exemplary solar cell device formed with a structure shown in FIG. 3.

FIG. 5 provides electrical (I-V) characteristics of a finished exemplary "bufferless" flexible solar cell after spalling, as described above with respect to FIG. 3. The graph shows the current density J and power density P as a function of voltage. The open circuit voltage $V_{oc}$, short circuit current density $J_{sc}$, fill factor FF and efficiency η of the structure 100 are provided in chart form.

Epitaxial methods known to those of skill in the art, including chemical vapor deposition such as MOCVD, can be employed for forming the layers of the structures disclosed herein on the germanium substrates 22.

Given the discussion thus far, it will be appreciated that, in general terms, an exemplary method includes the steps of providing a germanium substrate 22 and forming a buffer region 124 directly on the germanium substrate 22, the buffer region including a highly doped, electrically conductive layer 124A comprising gallium arsenide. The method further includes growing a solar cell structure 100 in inverted order on the buffer region, the solar cell structure including an absorbing layer 102 comprising gallium arsenide, an emitter layer 104, a window layer 108 adjoining the highly doped, electrically conductive layer 124A, the emitter and window layers being formed between the buffer region 124 and the absorbing layer 102, and a back surface field layer 106 formed on a side of the absorbing layer 102 opposite from the substrate 22. Unlike the structure 70 of FIG. 2, no buffer region or etch stop layer is grown between the germanium substrate 22 and the highly doped, electrically conductive layer 124A. As the buffer region 74 of the structure 70 shown in FIG. 2 is relatively thick, less time is required to grow the structure 100 than the structure 70. A metal stressor layer is attached to the inverted solar cell structure and a flexible handle layer is attached to the metal layer. The method further includes spalling the solar cell structure under the buffer region wherein a fracture takes place at or below an interface between the buffer region and the germanium substrate using the metal stressor and flexible handle layers. The method may further include removal of a residual germanium layer 122, if present, following spalling, so that the highly doped, electrically conductive layer 124A can function as an ohmic contact layer for the solar cell structure. It will be appreciated that the above-described method can be employed in the fabrication of single or multi junction solar cell structures. The method may further include forming contact metal on the highly doped, electrically conductive layer A method in accordance with a further exemplary embodiment includes providing a germanium substrate 22, forming a buffer region 124 directly on the germanium substrate, the buffer region including a highly doped, electrically conductive layer 124A comprising a III-V material, growing a single or multi junction solar cell structure including at least one III-V absorbing layer in inverted order on the buffer region such that the highly doped, electrically conductive layer functions as a buffer layer between the germanium substrate and the solar cell structure, attaching a metal stressor layer 140 to the solar cell structure, attaching a flexible handle layer 150 to the metal stressor layer, spalling the solar cell structure (e.g. structure 100) under the buffer region 124 wherein a fracture takes place at or below an interface between the buffer region and the germanium substrate 22 using the metal stressor and flexible handle layers. If present on the buffer region following spalling, the method further includes removing a residual germanium layer 122 from the buffer region. The highly doped, electrically conductive layer 124A is functional as an ohmic contact layer for the solar cell structure upon removal of the residual germanium layer, if present, or following spalling if no residual germanium layer is remaining.

In accordance with a further aspect, a solar cell structure is provided that comprises a germanium substrate 22 and a buffer region 124 formed directly on the germanium substrate, the buffer region including a highly doped, electrically conductive layer comprising gallium arsenide. A solar cell structure (e.g. structure 100) is positioned in inverted order on the buffer region 124. The solar cell structure includes an absorbing layer 102 comprising gallium arsenide, an emitter layer 104, a window layer 108 adjoining the highly doped, electrically conductive layer of the buffer region, the emitter and window layers being formed between the buffer region and the absorbing layer, and a back surface field layer formed on a side of the absorbing layer opposite from the substrate. The highly doped, electrically conductive layer 124A is functional as a buffer layer between the germanium substrate and the solar cell structure and is further functional as an ohmic contact layer for the solar cell structure upon removal of the germanium substrate. The structure described above has a buffer layer comprising $Si:In_{0.01}Ga_{0.99}As$ in a further exemplary embodiment. The substrate is p-type germanium 6° off towards <111> orientation in a further exemplary embodiment. A metal stressor layer is attached to the solar cell structure and a flexible handle layer is attached to the metal stressor layer in accordance with a further embodiment(s). The highly doped, electrically conductive layer 124A has a dopant level between 1E18-1E19 in one or more further embodiments of the structure. The highly doped, electrically conductive layer comprises $Si:In_{0.01}Ga_{0.99}As$ in one exemplary embodiment. A phosphide-based nucleation layer is provided between the germanium substrate and the highly doped, electrically conductive layer in another exemplary embodiment. The highly doped, electrically conductive layer has a dopant level between 1E18-1E19 in one or more exemplary embodiments. The nucleation layer comprises $Si:In_{0.5}Ga_{0.5}P$ in one or more embodiments of the structure. The solar cell structure is a single junction solar cell structure in one or more embodiments. In other embodiments, the solar cell structure may include a multi junction cell having more than one absorbing layer.

Those skilled in the art will appreciate that the exemplary structures discussed above can be distributed in raw form or incorporated as parts of intermediate products or end products that benefit from having photovoltaic elements therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
    a germanium substrate;
    a buffer region formed directly on the germanium substrate, the buffer region including a highly doped, electrically conductive layer comprising gallium arsenide, and
    a solar cell structure in inverted order on the buffer region, the solar cell structure including an absorbing layer comprising gallium arsenide, an emitter layer, a window layer adjoining and directly contacting the highly doped, electrically conductive layer of the buffer region and the emitter layer, the emitter and window layers being formed between the buffer region and the absorbing layer, and a back surface field layer formed on a side of the absorbing layer opposite from the substrate,
    wherein the highly doped, electrically conductive layer is configured to be functional as a buffer layer between the germanium substrate and the solar cell structure, thereby preventing antiphase defects, and is further configured for employment as an ohmic contact layer for the solar cell structure.

2. The structure of claim 1, wherein the highly doped, electrically conductive layer comprises $Si:In_{0.01}Ga_{0.99}As$.

3. The structure of claim 1, wherein the substrate is p-type germanium 6° off towards <111> orientation.

4. The structure of claim 1, further including a metal stressor layer attached to the solar cell structure and a flexible handle layer attached to the metal layer for facilitating formation of a fracture beneath the buffer region.

5. The structure of claim 1, wherein the highly doped, electrically conductive layer has a dopant level between 1E18-1E19.

6. The structure of claim 5, wherein the highly doped, electrically conductive layer comprises $Si:In_{0.01}Ga_{0.99}As$.

7. The structure of claim 6, wherein the buffer region further includes a phosphide-based nucleation layer between and directly contacting the germanium substrate and the highly doped, electrically conductive layer.

8. The structure of claim 7, wherein the nucleation layer comprises $Si:In_{0.5}Ga_{0.5}P$.

9. The structure of claim 6, wherein the highly doped, electrically conductive layer has a thickness of 0.5 µm.

10. The structure of claim 1, wherein the solar cell structure is a single junction solar cell structure.

11. A structure consisting essentially of:
    a germanium substrate;
    a buffer region formed directly on the germanium substrate, the buffer region including a highly doped, electrically conductive layer comprising gallium arsenide, and
    a solar cell structure in inverted order on the buffer region, the solar cell structure including an absorbing layer comprising gallium arsenide, an emitter layer, a window layer adjoining and directly contacting the highly doped, electrically conductive layer of the buffer region and the emitter layer, the emitter and window layers being formed between the buffer region and the absorbing layer, and a back surface field layer formed on a side of the absorbing layer opposite from the substrate,
    wherein the highly doped, electrically conductive layer is configured to be functional as a buffer layer between the germanium substrate and the solar cell structure, thereby preventing antiphase defects, and is further configured to function as an ohmic contact layer for the solar cell structure.

12. The structure of claim 11, wherein the highly doped, electrically conductive layer has a thickness of 0.5 µm.

13. The structure of claim 11, wherein the highly doped, electrically conductive layer directly contacts the germanium substrate.

14. The structure of claim 1, further including a nucleation layer between and directly contacting the germanium substrate and the highly doped, electrically conductive layer.

* * * * *